US010559357B1

(12) United States Patent
Cline

(10) Patent No.: US 10,559,357 B1
(45) Date of Patent: Feb. 11, 2020

(54) MEMORY CIRCUIT HAVING NON-VOLATILE MEMORY CELL AND METHODS OF USING

(71) Applicant: Lattice Semiconductor Corporation, Portland, OR (US)

(72) Inventor: Ronald L. Cline, San Jose, CA (US)

(73) Assignee: Lattice Semiconductor Corporation, Portland, OR (US)

(*) Notice: Subject to any disclaimer, the term of this patent is extended or adjusted under 35 U.S.C. 154(b) by 0 days.

(21) Appl. No.: 16/056,390

(22) Filed: Aug. 6, 2018

(51) Int. Cl.
*G11C 11/00* (2006.01)
*G11C 14/00* (2006.01)
*H03K 19/1776* (2020.01)
*G11C 11/16* (2006.01)

(52) U.S. Cl.
CPC ..... *G11C 14/0081* (2013.01); *H03K 19/1776* (2013.01); *G11C 11/161* (2013.01); *G11C 11/1673* (2013.01); *G11C 11/1675* (2013.01)

(58) Field of Classification Search
CPC .............. G11C 14/0081; G11C 11/161; G11C 11/1673; G11C 11/1675; H03K 19/1776
USPC .................................................. 365/154, 158
See application file for complete search history.

(56) References Cited

U.S. PATENT DOCUMENTS

| 7,042,756 | B2 | 5/2006 | Madurawe |
| 7,486,535 | B2 | 2/2009 | Perkins |
| 7,796,417 | B1 | 9/2010 | Lewis |
| 8,604,572 | B2 | 12/2013 | Wang et al. |
| 9,437,272 | B1* | 9/2016 | Lu .......................... G11C 11/161 |
| 9,520,173 | B1* | 12/2016 | Baker, Jr. ............ G11C 11/1675 |
| 9,672,935 | B2 | 6/2017 | Cline et al. |
| 9,728,259 | B1* | 8/2017 | Jung ..................... G11C 15/046 |
| 2006/0028894 | A1 | 2/2006 | Brennan et al. |
| 2006/0146596 | A1 | 7/2006 | Madurawe |
| 2007/0146012 | A1 | 6/2007 | Murphy et al. |
| 2008/0084724 | A1* | 4/2008 | Nozieres ................ G11C 15/02 365/50 |
| 2008/0101146 | A1 | 5/2008 | Paak et al. |
| 2008/0112220 | A1 | 5/2008 | Lee et al. |
| 2008/0237788 | A1 | 10/2008 | Perkins |
| 2010/0131812 | A1 | 5/2010 | Mohammad |
| 2013/0201746 | A1 | 8/2013 | Chung |

(Continued)

OTHER PUBLICATIONS

Bai et al., "Stochastic-Based Spin-Programmable Gate Array with Emerging MTJ Device Technology," Journal of Low Power Electronics and Applications, Aug. 12, 2016, 23 Pages, vol. 6, No. 15.

(Continued)

*Primary Examiner* — Huan Hoang
(74) *Attorney, Agent, or Firm* — Haynes and Boone, LLP

(57) ABSTRACT

One aspect relates to a memory circuit that has a programmable non-volatile memory (NVM) cell configured to generate an NVM output signal indicative of a program state of the NVM cell and to configure a volatile output based on the program state of the NVM cell. The NVM cell comprises a first magnetic tunnel junction (MTJ) device, a first select device connected in series with the first MTJ device at a first node, and a first pass device. The memory circuit also may have a programmable (independently of the NVM cell) volatile memory (VM) cell configured to receive the NVM output signal at a VM input node and to generate a VM output signal indicative of the program state of the VM cell.

20 Claims, 4 Drawing Sheets

(56) References Cited

U.S. PATENT DOCUMENTS

| | | |
|---|---|---|
| 2014/0071726 A1 | 3/2014 | Chung |
| 2015/0310926 A1 | 10/2015 | Akamatsu |
| 2015/0325316 A1 | 11/2015 | Kang et al. |
| 2016/0133335 A1 | 5/2016 | Kim et al. |

OTHER PUBLICATIONS

Choudhary et al., "A Review on Magnetic Tunnel Junction Technology," International Research Journal of Engineering and Technology (IRJET), Jul. 2015, pp. 1635-1639, vol. 2, Issue 4.

Goncalves et al., "Non-Volatile FPGAs Based on Spintronic Devices," 2013 $50^{th}$ ACM/EDAC/IEEE Design Automation Conference (DAC), Jul. 18, 2013, 3 Pages, IEEE.

Tanamoto et al., "Scalability of Spin FPGA: A Reconfigurable Architecture Based on Spin MOSFET," J. Appl. Phys., Apr. 8, 2011, 3 Pages, arXiv:1104.1493v1.

Wang et al., "Tunnel Junction with Perpendicular Magnetic Anisotropy: Status and Challenges," Micromachines, Aug. 10, 2015, pp. 1023-1045, vol. 6.

\* cited by examiner

MEMORY CIRCUIT HAVING NON-VOLATILE MEMORY CELL AND METHODS OF USING

CROSS-REFERENCE TO RELATED APPLICATIONS

This application is related to U.S. Pat. No. 9,672,935, issued on Jun. 6, 2017, currently undergoing examination as U.S. Reissue patent application Ser. No. 15/975,506, filed on May 9, 2018, which are incorporated herein by reference in their entirety for all purposes.

BACKGROUND

Field

In some aspects, the disclosure relates to electronics and, more specifically but not exclusively, to programmable non-volatile memory circuits.

Related Art

This section introduces aspects that may help facilitate a better understanding of the disclosure. Accordingly, the statements of this section are to be read in this light and are not to be understood as admissions about what is prior art or what is not prior art.

Non-volatile (NV) memory is used for configuration pattern storage for programmable logic devices such as field-programmable gate arrays (FPGAs). When this NV memory is external to the FPGA, the pattern is transferred to the FPGA's internal configuration static random-access memory (SRAM) through regular data pins. There are some product applications, however, where the NV memory block is internally embedded within the FPGA chip itself, so as to provide secure, independent configuration storage even when the FPGA is powered down. This memory pattern is normally transferred internally during chip power-up as an "initialization" sequence, with the data transfer most often taking place in the conventional fashion—as if the configuration pattern was externally presented to the FPGA's configuration controller even though the source is actually on chip.

SUMMARY

One aspect relates to a memory circuit comprising: a programmable non-volatile memory (NVM) cell configured to generate an NVM output signal indicative of a program state of the NVM cell comprising a first magnetic tunnel junction (MTJ) device, a first select device connected with the MTJ device at a first node, and a first pass device; and a programmable volatile memory (VM) cell configured to receive the NVM output signal at a VM input node and to generate a VM output signal indicative of a program state of the VM cell, where the first pass device is connected between the first node and the VM input node.

One aspect relates to an article of manufacture including a memory circuit. The memory circuit includes volatile output circuitry (VOC) and a programmable NVM cell. The programmable NVM cell is configured to generate an NVM output signal indicative of a program state of the NVM cell. The NVM cell includes a first MTJ device, a first select device connected with the first MTJ device at a first node, and a first pass device connected between the first node and a VOC input node of the VOC and configured to selectively pass a voltage at the first node to the VOC input node. The NVM cell also includes a second MTJ device, a second select device connected with the second MTJ device at a second node, and a second pass device connected between the second node and the VOC input node and configured to pass a voltage at the second node to the VOC input node. The VOC is connected to receive the NVM output signal from the NVM cell at the VOC input node and generate a VOC output signal indicative of the program state of the NVM cell.

One aspect relates to a method for operating a programmable NVM cell configured to generate an NVM output signal indicative of a program state of the NVM cell. The NVM cell includes a first MTJ device, a first select device connected with the first MTJ device at a first node, and a first pass device connected between the first node and an NVM output node and configured to selectively pass a voltage at the first node to the NVM output node. The NVM cell also includes a second MTJ device, a second select device connected with the second MTJ device at a second node, and a second pass device connected between the second node and the NVM output node and configured to selectively pass a voltage at the second node to the NVM output node. The method includes reading a bit value from the NVM cell by turning off the first select device; applying a read voltage to the first MTJ device; and turning on the first pass device to pass a voltage at the first node to the NVM output node; when the first MTJ device is in a first resistance mode, the voltage at the first node passed to the NVM output node will be at a first level; and when the first MTJ device is in a second resistance mode, the voltage at the first node passed to the NVM output node will be at a second level different from the first level.

One aspect relates to an article of manufacture including a memory circuit. The memory circuit includes a programmable NVM cell configured to generate an NVM output signal indicative of a program state of the NVM cell, the NVM cell including a first MTJ device, a first select device connected with the first MTJ device at a first node, a first pass device connected between the first node and a NVM output node, a second MTJ device, a second select device connected with the second MTJ device at a second node, and a second pass device connected between the second node and the NVM output node. The memory circuit also includes a programmable VM cell configured to receive the NVM output signal at a VM input node and to generate a VM output signal indicative of the program state of the VM cell, where the first pass device is connected between the first node and the VM input node and configured to selectively pass a voltage at the first node to the VM input node. In some aspects, the memory circuit also includes control logic configured to program the NVM cell using techniques based on thermal assisted switching and/or spin torque transfer.

One aspect relates to an article of manufacture including an FPGA with distributed SRAM configuration cells where at least a subset of the SRAM configuration cells have an associated and local non-volatile memory cell that is capable of programming its associated SRAM cell. The FGPA may be fabricated at least in part in a complementary metal-oxide-semiconductor (CMOS) process. The FPGA may be an integrated circuit that includes multiple instances of memory circuits. The memory circuits may include programmable NVM cells that include MTJ devices.

BRIEF DESCRIPTION OF THE DRAWINGS

Embodiments and implementations of the disclosure will become more fully apparent from the following detailed

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The time taken for initialization of an FPGA can be in the hundreds of milliseconds, especially for more-complex programmable devices. The latency incurred from this initialization delay can be detrimental to system operation. In addition, the energy (power times duration) of this initialization sequence can be so significant that power-reduction approaches, which include power-gating of the FPGA configuration storage, do not give a net improvement in energy usage, even at moderate power-cycle frequencies. Therefore, it is advantageous to utilize an approach which reduces both the power and the duration of this initialization process.

Current methods to reduce the initialization latency are generally based on parallelization of the transfer circuitry, which reduces the overall delay but does not affect the total energy and thus giving no advantage towards achieving power reduction during initialization. Moreover, the latency issue is improved, but not eliminated.

Figure 1:
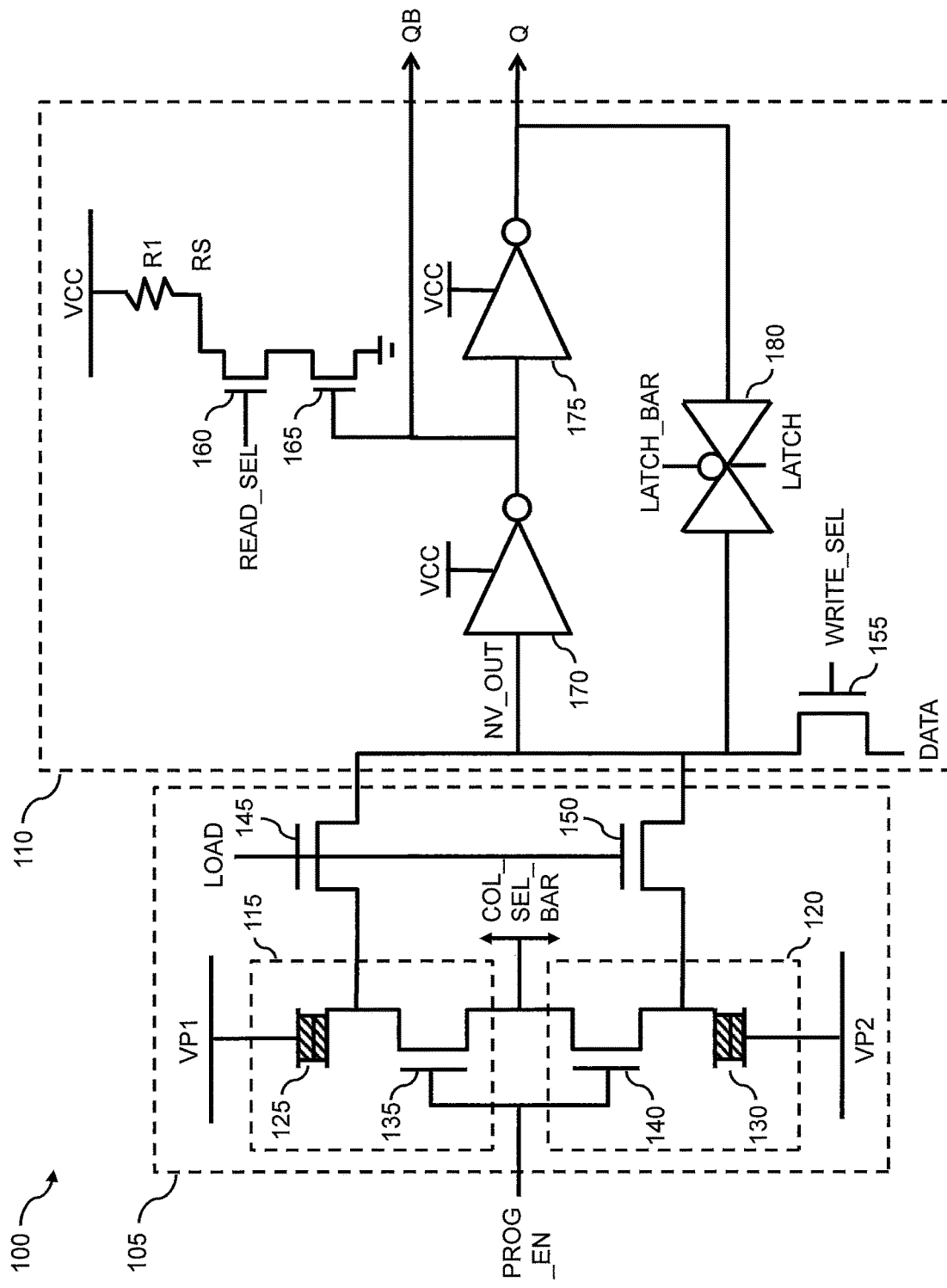
FIG. 1 is a schematic circuit diagram of a memory circuit for storing at least one bit of information in accordance with one or more embodiments of the present disclosure.

FIG. 1 is a schematic circuit diagram of a memory circuit 100 for storing at least one bit of information in accordance with one or more embodiments of the present disclosure. The memory circuit 100 will typically be one of many instances of similar memory circuits distributed over an integrated circuit, such as an FPGA. As described in further detail below, various electronic signals (e.g., voltage signals, current signals) are applied to different input nodes of the memory circuit 100 to selectively store one bit of information into the memory circuit 100 and then subsequently read that stored bit of information from the memory circuit 100, where the bit of information is represented by voltage levels at an output node Q, a complementary output node QB, and a read-sense node RS.

In some aspects, depending on logic applied downstream of the memory circuit 100, a (relatively) high voltage level at the node Q, a corresponding (relatively) low voltage level at the node QB, and a corresponding (relatively) high voltage level at the node RS may be interpreted as either a 1 or a 0, while the opposite voltage levels will be interpreted as the other bit value. For simplicity of description, the following discussion assumes that a bit value of 1 is represented by high voltages at nodes NV_OUT, Q, and RS, while a bit value of 0 is represented by low voltages at those nodes. Those skilled in that art will understand that an integrated circuit can be implemented using the complementary logic convention.

As shown in FIG. 1, the memory circuit 100 has two memory cells configured together: a programmable, differential, non-volatile memory (NVM) cell 105 and a programmable, volatile memory (VM) cell 110, where the VM cell 110 is an SRAM cell with a latch architecture. The NVM cell 105 includes magnetic tunnel junction (MTJ) cells 115 and 120 and transistor devices 145 and 150. The MTJ cell 115 includes an MTJ device 125 and a transistor device 135. The MTJ cell 120 includes an MTJ device 130 and a transistor device 140. The VM cell 110 includes transistor devices 155, 160, and 165, inverters 170 and 175, and a transmission gate 180. In some cases, the transistor devices 135, 140, 145, 150, 155, 160, and 165 are N-type transistor devices.

The NVM cell 105 can be programmed to present either a (relatively) high voltage level (i.e., bit value 1) or a (relatively) low voltage level (i.e., bit value 0) at the output node NV_OUT of the NVM cell 105. In an embodiment, the NVM cell 105 can be programmed by setting a resistance level presented by the MTJ devices 125 and 130. Each of the MTJ devices 125 and 130 can be set to present either a (relatively) high resistance level or a (relatively) low resistance level. The resistance levels presented by the MTJ devices 125 and 130 determine a voltage level presented at the NVM-cell output node NV_OUT. In some aspects, electrical signals (e.g., voltages, currents) may be applied to the MTJ devices 125 and 130 to set a magnetization direction of one or more magnetic layers (e.g., ferromagnetic layers) of the MTJ devices 125 and 130. Relative magnetization directions of the magnetic layer(s) cause the MTJ devices 125 and 130 to present either a low resistance or a high resistance. In an aspect, the MTJ devices 125 and 130 have the same low resistance level and the same high resistance level. As an example, the low resistance level may be provided by R and the high resistance level may be provided by 2R. In this example, a ratio of the high resistance level to the low resistance level is 2. Other ratios between the low and high resistance levels may be utilized based on application.

More generally, the MTJ devices 125 and 130 may have the same, or may have different, low and high resistance levels. In this regard, each of the MTJ devices 125 and 130 may be referred to as operating in a low resistance mode when operated at its respective low resistance level and operating in a high resistance mode when operated at its respective high resistance level.

In some embodiments, in operation, the MTJ devices 125 and 130 are in opposite resistance states. In this regard, the MTJ device 125 is set to a low resistance state when the MTJ device 130 is set to a high resistance state, and vice versa. In some cases, the resistance states of the MTJ devices 125 and 130 can be changed (e.g., reversed) by providing appropriate electrical signals to re-program the MTJ devices 125 and 130.

In one example, to program the NVM cell 105 to present a high voltage level at the output node NV_OUT (e.g., the NVM cell 105 stores a 1), a suitable sequence of programming electrical signals (e.g., voltages, currents) can be applied to the (previously unprogrammed) NVM cell 105 to set the MTJ device 125 to a low resistance state and the MTJ device 130 to a high resistance state. In this case, when a suitable sequence of transfer electrical signals is applied to the NVM cell 105, the output node NV_OUT will be driven high. Alternatively, in this example, to program the NVM cell 105 to present a low voltage level at the output node NV_OUT (e.g., the NVM cell 105 stores a 0), a different, suitable sequence of programming electrical signals can be applied to the (previously unprogrammed) NVM cell 105 to set the MTJ device 125 to a high resistance state and the MTJ device 130 to a low resistance state. In this case, when the same, suitable sequence of transfer electrical signals is applied to the NVM cell 105, the output node NV_OUT will be driven low.

The VM cell 110 can also be programmed to present either high voltage levels or low voltage levels at the VM-cell output nodes Q and RS and correspondingly a low or high voltage level at the complementary VM-cell output node QB. In particular, for example, to program the VM cell 110 to present a high voltage level (i.e., bit value 1) at the node RS, a suitable sequence of write voltages can be applied to the VM cell 110 to latch in a high voltage level at an input of the inverter 170. In this case, when a suitable sequence of read voltages are applied to the VM cell 110, the output node RS will be driven high. Alternatively, to program the VM cell 110 to present a low voltage level (i.e., bit value 0) at the node RS, a different, suitable set of write voltages can be applied to the VM cell 110 to latch in a low voltage level at an input of the inverter 170. In this case, when the same, suitable sequence of read voltages are applied to the VM cell 110, the output node RS will be driven low.

The VM cell 110 can also be programmed by transferring the bit value stored in the NVM cell 105 into the VM cell 110 by applying a suitable sequence of transfer electronic signals (e.g., voltages, currents) to both the NVM cell 105 and the VM cell 110. Note that the bit value transferred from the NVM cell 105 into the VM cell 110 can be subsequently changed by re-programming the VM cell 110 as described previously.

It is noted that the memory circuit 100 of FIG. 1 provides one example implementation of a memory circuit. Other implementations of a memory circuit may be utilized. For example, in an alternative embodiment of the memory circuit 100, the series-connected transistors 160 and 165 may be connected to the node Q, instead of the node QB,  with a corresponding inversion of the logic applied to interpret the corresponding voltage level.

In some embodiments, as shown for example in FIG. 1, MTJ devices may be utilized in magnetic RAM (MRAM) as a non-volatile portion of a distributed configuration. Utilization of MTJ devices may facilitate low power instant-on configuration and background reconfiguration capability. In some aspects, memory cells that include MTJ devices may be re-programmed by changing a resistance level presented by the MTJ devices. Such re-programmability is in contrast to conventional approaches. In some aspects, the MTJ devices may be readily incorporated into manufacturing processes. In this regard, in some cases, metallization layers of the MTJ devices may be disposed after transistor devices have already been defined on a wafer such that the MTJ devices may be manufactured without affecting parameters associated with the transistor devices, thus allowing for efficient manufacturing of circuitry (e.g., memory circuitry) formed of the MTJ devices and transistors devices. In some aspects, ability to distribute MTJ elements within standard CMOS circuitry may allow local bit-wise connections, thus facilitating elimination of energy costs associated with communicating configuration data across FPGA devices. In addition, the MTJ devices may be programmed in isolation and independent of a VM cell (e.g., the VM cell 110), thus allowing background reconfiguration while retaining current configuration functionality of the VM cell.

In some aspects, a standard deviation of resistance values of MTJ devices (e.g., 125, 130) operating in the low resistance mode (e.g., MTJ device configured to nominally have the low resistance value) is generally narrow. Similarly, a standard deviation of resistance values of MTJ devices operating in the high resistance mode (e.g., MTJ devices configured to nominally have the high resistance value) is generally narrow. As such, for example, a probability of an MTJ device having a resistance value closer to the high resistance value than the low resistance value when in fact the MTJ is configured to have the low resistance value is generally negligible.

Figure 2:
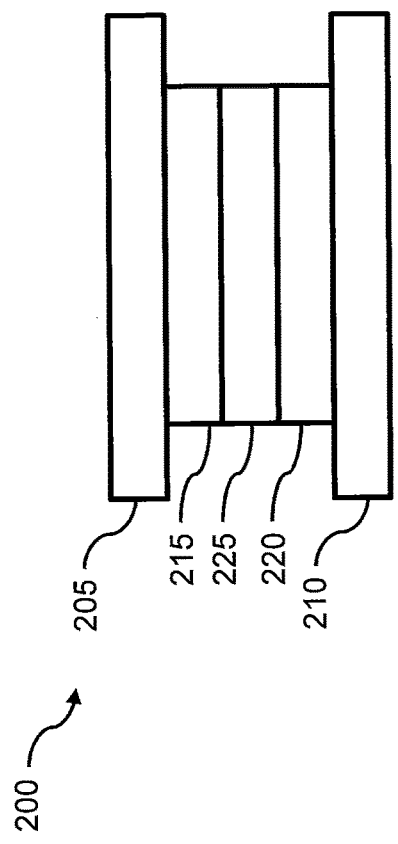
FIG. 2 illustrates an example of a magnetic tunnel junction device in accordance with one or more embodiments of the present disclosure.

FIG. 2 illustrates an example of an MTJ device 200 in accordance with one or more embodiments of the present disclosure. In an embodiment, the MTJ devices 125 and/or 130 may be the MTJ device 200. For explanatory purposes, the MTJ device 200 is the MTJ device 125 of FIG. 1. The MTJ device 200 includes contacts 205 and 210, magnetic layers 215 and 220, and a non-magnetic layer 225. The magnetic layers 215 and 220 and the non-magnetic layer 225 are disposed between the contacts 205 and 210 (e.g., also referred to as metallization layers). In some cases, the magnetic layers 215 and 220 are ferromagnetic layers. Although the layers 215, 220, and 225 are each depicted as a single layer, the layers 215, 220, and/or 225 may include two or more layers of different material.

In one example, with reference to FIG. 1, the contact 205 may be tied to a voltage supply VP1 and the contact 210 may be connected to the transistor device 135. In some cases, the transistor device 135 and the transistor device 140 may be referred to as access devices or select devices, since they may be utilized to allow the MTJ devices 125 and 130 to be programmed. In FIG. 1, the transistor device 145 is connected to a node between the MTJ device 125 and the transistor device 135, and the transistor device 150 is connected to a node between the MTJ device 130 and the transistor device 140. Taps for the output node NV_OUT may be made to a node/contact that connects the MTJ devices 125 and 130 to the transistor devices 135 and 140, so as to access directly the MTJ devices 125 and 130 through the voltage supplies VP1 and VP2 and the contacts 205 and 210.

Electrical signals may be applied to the magnetic layers 215 and 220 to set (e.g., program) the resistance state (e.g., low or high resistance state) of the MTJ device 200. Magnetization direction of the magnetic layers 215 and 220 may be based on a spin of electrons flowing through the magnetic layers 215 and 220. In some cases, the magnetic layer 215 may be utilized as a free layer (e.g., also referred to as a floating layer) and the magnetic layer 220 may be utilized as a fixed layer (e.g., also referred to as a pinned layer). In some cases, the fixed layer is thicker than the free layer. As the fixed layer, the magnetic layer 220 has a magnetization direction that is fixed. In some cases, to keep the magnetization direction fixed, a pinning layer (not shown in FIG. 2) may be disposed between and in contact with the magnetic layer 220 and the contact 210. The pinning layer may be an anti-ferromagnetic layer.

Figure 3B:
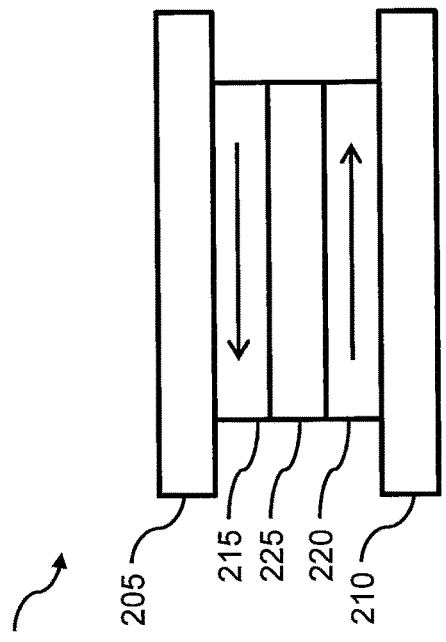
FIG. 3B illustrates a magnetic tunnel junction device in which magnetization directions of magnetic layers are anti-parallel to each other in accordance with one or more embodiments of the present disclosure.
Figure 3A:
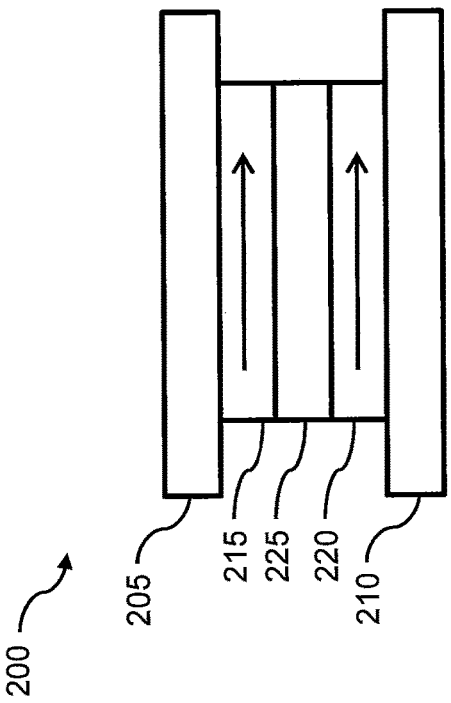
FIG. 3A illustrates a magnetic tunnel junction device in which magnetization directions of magnetic layers are parallel to each other in accordance with one or more embodiments of the present disclosure.

The resistance state of the MTJ device 200 is based on the magnetization direction of the magnetic layer 215 relative to that of the magnetic layer 220. As such, to set the resistance state of the MTJ device 200, the magnetization direction of the magnetic layer 215 (e.g., the free layer) may be set such that the magnetization direction is parallel to or antiparallel to the magnetization direction of the fixed layer. As an example, FIG. 3A illustrates the MTJ device 200 in which the magnetization directions of the magnetic layer 215 and the magnetic layer 220 are parallel (P) to each other, and FIG. 3B illustrates the MTJ device 200 in which the magnetization directions of the magnetic layer 215 and the magnetic layer 220 are antiparallel (AP) to each other.

When the magnetization directions are parallel, electrons are more likely to tunnel through the non-magnetic layer 225 in response to an applied voltage. When the magnetization directions are antiparallel, electrons are less likely to tunnel through the non-magnetic layer 225 in response to an applied voltage, and thus the MTJ device 200 has a higher resistance relative to when the magnetization directions are parallel. As such, the non-magnetic layer 225 may be referred to as a tunnel barrier layer, the low resistance state may be referred to as a parallel state, and the high resistance state may be referred to as an antiparallel state.

As an example, in an embodiment, spin-transfer torque (STT) may be utilized to set the resistance state of the MTJ device 200. In STT, to set the magnetization direction of the magnetic layer 215A, a spin-polarized current may be applied to the magnetic layer 215. A spin-polarized current may have a majority of its electrons having spin-up or spin-down, in contrast to an unpolarized current in which around 50% of electrons have spin-up and around 50% of electrons have spin-down. The spin-polarized current may cause the magnetic layer 215 to have a magnetization direction parallel to the magnetic layer 220, as shown in FIG. 3A, or antiparallel to the magnetic layer 220, as shown in FIG. 3B. In some cases, an unpolarized current may be passed through the magnetic layer 220 to produce a spin-polarized current, which is then applied to the magnetic layer 215 to transfer angular momentum to the magnetic layer 215 in order to change the magnetization direction of the magnetic layer 215A. It is noted that STT is provided by way of non-limiting example. Other manners by which to set the resistance state of the MTJ device 200 can be utilized.

Figure 4:
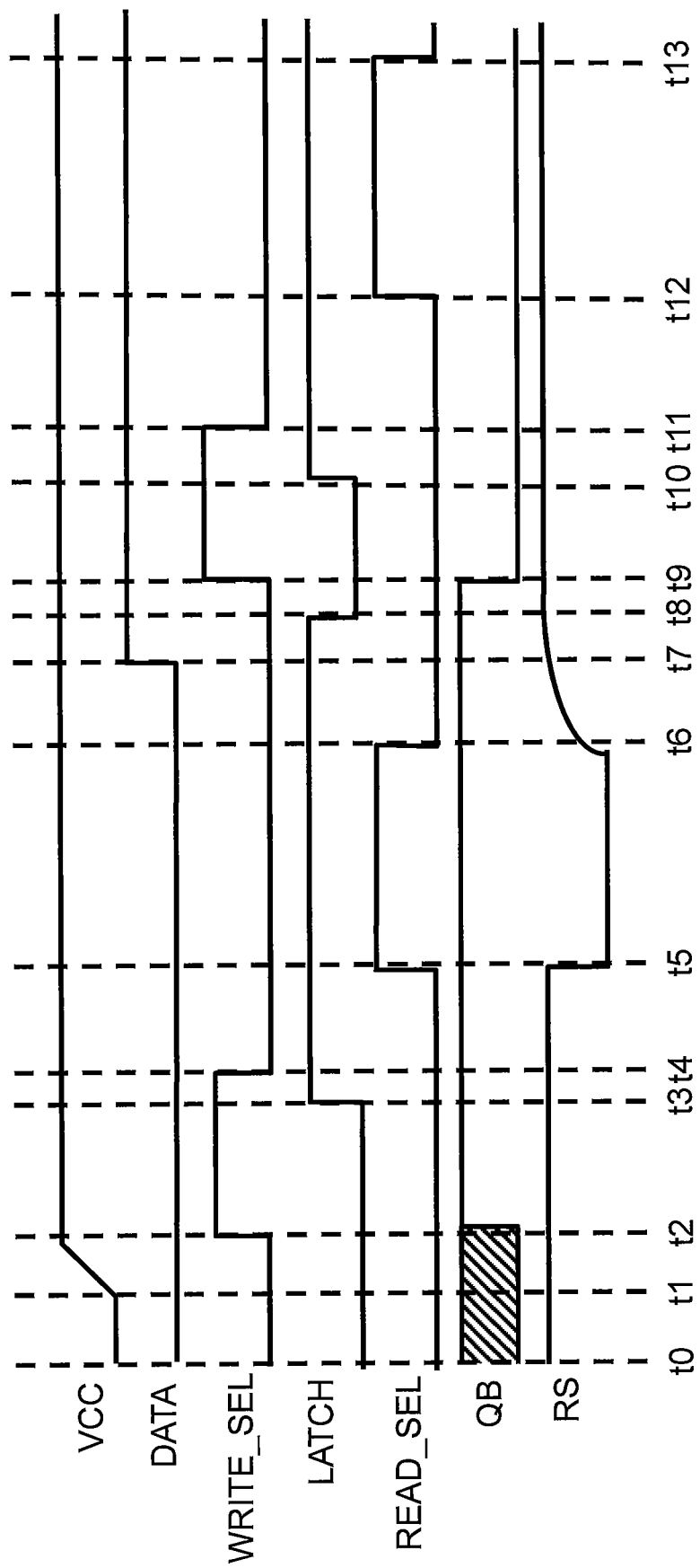
FIG. 4 is a set of waveforms representing a suitable sequence of voltages used to write and read a bit value into and out of a volatile memory cell in accordance with one or more embodiments of the present disclosure.

FIG. 4 is a set of waveforms representing a suitable sequence of voltages used to write and read a bit value into and out of the VM cell 110 of FIG. 1, according to one or more embodiments of the present disclosure. In particular, the waveforms of FIG. 4 represent the following sequence of operations: (i) program the VM cell 110 by writing a bit value of 0 into the VM cell 110, (ii) then read the stored bit value 0 from the VM cell 110, (iii) then re-program the VM cell 110 by writing a bit value of 1 into the VM cell 110, and (iv) then read the stored bit value 1 from the VM cell 110. During these operations, the (programmed or unprogrammed) NVM cell 105 is disabled and isolated from the VM cell 110 by setting all of the following voltage levels low (e.g., to 0V): PROG_EN (e.g., program-enable control signal), COL_SEL_BAR, VP1, VP2, and LOAD. In an embodiment, the voltage levels may be set (e.g., to logic high or logic low) by control logic (e.g., also referred to as control logic circuit). For example, the control logic may be part of the memory circuit 100 or otherwise in electrical communication with the memory circuit 100.

In particular, as shown in FIG. 4, at time t0, the integrated circuit is powered off and, at time t1, the integrated circuit is powered on with the power supply voltage VCC rising from 0V to its operating level. To store the bit value 0 into the VM cell 110, with the data voltage DATA and the latch voltage LATCH both low, the write-select voltage WRITE_SEL is driven high at time t2, which turns on the transistor device 155 (e.g., also referred to as a write device), which allows the low DATA voltage to appear at the input of the inverter 170. This, in turn, drives the output of the inverter 170 (i.e., node QB) high and the output of the inverter 175 (i.e., node Q) low. Prior to this time, the voltages at nodes QB and Q were indefinite.

At time t3, the latch voltage LATCH is driven high, which turns on the transmission gate 180, which enables the low voltage at node Q to be fed back to the input of the inverter 170. At time t4, the voltage WRITE_SEL is driven low, which turns off the transistor device 155 and latches the bit value 0 into the VM cell 110.

To read the bit value 0 from the VM cell 110, at time t5, the read-select voltage READ_SEL is driven high, which turns on the transistor device 160 (e.g., also referred to as a read device). With the node QB high, the transistor device 165 will also be on, which drives the node RS low. At time t6, the voltage READ_SEL is driven low, thereby ending this read operation of the VM cell 110. Note that, when READ_SEL is driven low, the transistor device 160 is turned off, and the node RS is driven high through a resistor R1.

To re-program the VM cell 110 to store the bit value 1, at time t7, the data voltage DATA is driven high, and, at time t8, the latch voltage LATCH is driven low to turn off the transmission gate 180 and isolate the input to the inverter 170 from the node Q. At time t9, the write-select voltage WRITE_SEL is driven high to turn on the transistor device 155 and allow the high DATA voltage to appear at the input of the inverter 170. This, in turn, drives the node QB low and the node Q high. At time t10, the latch voltage LATCH is driven high to turn on the transmission gate 180 and enable the high voltage at the node Q to be fed back to the input of the inverter 170. At time t11, the voltage WRITE_SEL is driven low to turn off the transistor device 155 and latch the bit value 1 into the VM cell 110.

To read the bit value 1 from the VM cell 110, at time t12, the read-select voltage READ_SEL is driven high, which turns on the transistor device 160. With the node QB low, the transistor device 165 will be off, which allows the node RS to stay high. At time t13, the voltage READ_SEL is driven low, thereby ending this second read operation of the VM cell 110.

In some embodiments, a suitable sequence of electrical signals may be used to program a bit value into NVM cell 105 of FIG. 1. During this operation, all of the following voltage levels are set low: DATA, LATCH, WRITE_SEL, READ_SEL, LOAD, and COL_SEL_BAR, such that the VM cell 110 is disabled and isolated from the NVM cell 105. Note that the VM cell 110 does not have to be disabled in order to program the NVM cell 105; it is sufficient for the VM cell 110 to be isolated from the NVM cell 105. Control logic may be utilized to program the NVM cell 105 using thermal assisted switching (TAS)-based techniques, STT-based techniques, and/or other techniques, as would be understood by one skilled in the art. The technique(s) utilized to program the NVM cell 105 may be based at least on implementation of the MTJ devices 125 and 130.

In one example, the NVM cell 105 may be programmed to a low resistance state as follows. The MTJ device 125 may be programmed to the low resistance state by setting COL_SEL_BAR to zero (e.g., 0V), raising PROG_EN to a high logic level, and applying a positive write voltage to VP1. Electrons flow from the transistor device 135 through the MTJ device 125, where the spin-polarized electrons of the magnetic layer 220 (e.g., the fixed layer) tunnel into the magnetic layer 215 (e.g., the free layer). As spin-polarized electrons parallel to the magnetic layer 220 accumulate in the magnetic layer 215, a threshold point is reached where the magnetic layer 215 switches and becomes spin-polarized parallel to the magnetic layer 220, thus creating the low resistance state for the MTJ device 125.

The MTJ device 125 may be programmed to the high resistance state by setting COL_SEL_BAR to a high programming voltage, raising PROG_EN to a high logic level, and applying a zero value voltage to VP1. Electrons flow from VP1 into the MTJ device 125 through the magnetic layer 215 (e.g., the free layer) and encounter the non-magnetic layer 225 (e.g., the tunnel barrier layer), whereupon electrons which have spins parallel to the magnetic layer 220 (e.g., the fixed layer) preferentially transition through the non-magnetic layer 225, leaving antiparallel spin electrons to accumulate in the magnetic layer 215. Accumulation eventually causes a switch to the high resistance state (e.g., the antiparallel state).

The MTJ device 130 may be programmed to the low resistance state and the high resistance state in a similar manner as the MTJ device 125, substituting VP2 for VP1 in the above examples provided for the MTJ device 125. In some aspects, when the MTJ device 125 is being programming, VP2 may be tied to the same voltage as COL_SEL_BAR in order to prevent the MTJ device 130 from being programmed. Similarly, when the MTJ device 130 is being programmed, VP1 may be tied to the same voltage as COL_SEL_BAR. The program enable PROG_EN is common to the transistor devices 135 and 140 and may be referred to as a common program-enable control signal.

Figure 5:
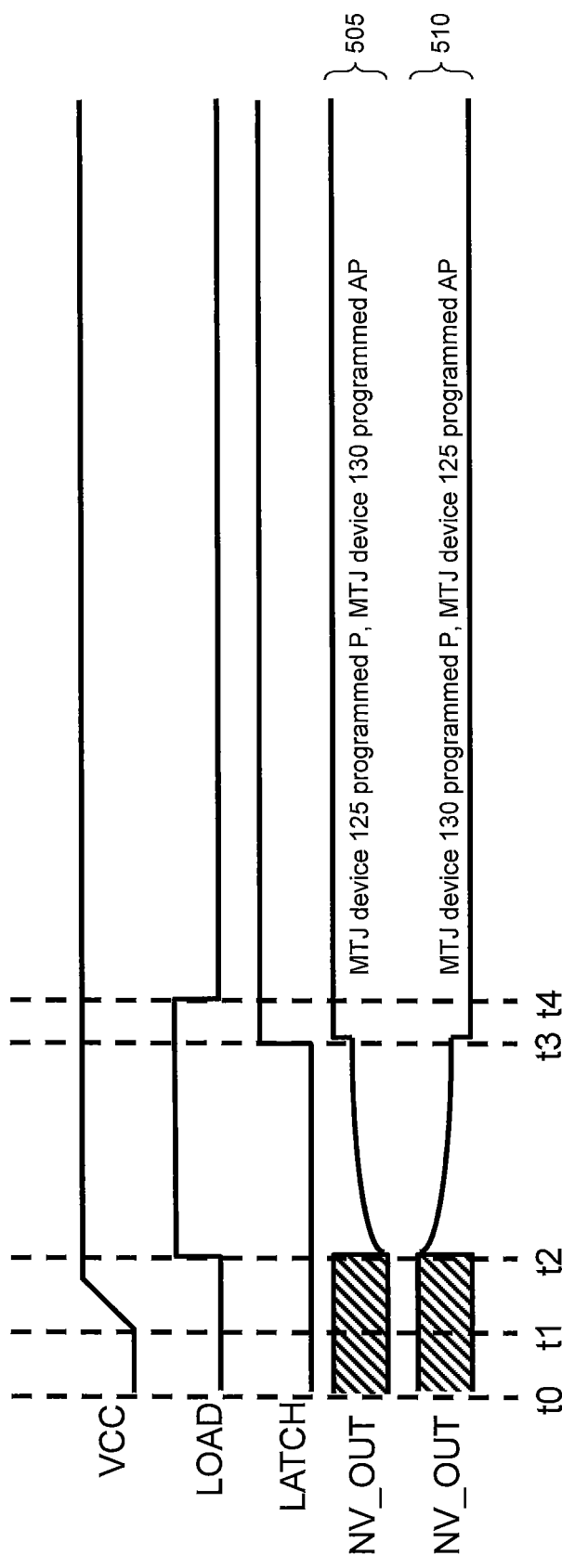
FIG. 5 is a set of waveforms representing a suitable sequence of voltages used to transfer a stored bit value from a programmed non-volatile memory cell to a volatile memory cell in accordance with one or more embodiments of the present disclosure.

FIG. 5 is a set of waveforms representing a suitable sequence of voltages used to transfer the stored bit value from the programmed NVM cell 105 to the VM cell 110 of FIG. 1 in accordance with one or more embodiments of the present disclosure. During this operation, all of the following voltage levels are set low: PROG_EN, VP2, DATA, WRITE_SEL, READ_SEL, and COL_SEL_BAR, while VP1 is at VCC. FIG. 5 presents two different waveforms for the voltage at the node NV_OUT: (i) one for the situation (labeled 505 in FIG. 5) in which the MTJ device 125 is set to a low resistance state (e.g., parallel state) and the MTJ device 130 is set to a high resistance state (e.g., antiparallel state) and (ii) another for the situation (labeled 510 in FIG. 5) in which the MTJ device 125 is set to a high resistance state and the MTJ device 130 is set to a low resistance state.

At time t0, the integrated circuit is powered off and, at time t1, the integrated circuit is powered on with the power supply voltage VCC rising from 0V to its operating level. At time t2, a transfer-enable voltage LOAD is driven high, which turns on the transistor devices 145 and 150 (e.g., also referred to as transfer devices or pass devices). The transfer-enable LOAD is common to the transistor devices 145 and 150 and may be referred to as a common transfer-enable control signal. Prior to time t2, the voltage at the node NV_OUT is indeterminate. After time t2, with the transistor devices 145 and 150 on, the node NV_OUT will be driven either high or low depending on the programming of the NVM cell 105. In particular, if the NVM cell 105 is programmed with a bit value 1, then the node NV_OUT will be driven high through the turned-on transistor device 145 and a voltage divider provided by the MTJ device 125 in the low resistance state and the MTJ device 130 in the high resistance state. Alternatively, if the NVM cell 105 is programmed with a bit value 0, then the node NV_OUT will be driven low through the transistor device 150 and a voltage divider provided by the MTJ device 125 in the high resistance state and the MTJ device 130 in the low resistance state. At time t3, the voltage LATCH is driven high to turn on the transmission gate 180 and latch the transferred bit value into the VM cell 110. At time t4, LOAD is driven low, ending this transfer operation. At this point, the VM cell 110 is isolated from the NVM cell 105 and latched with the transferred bit value, which will appear at the output node Q. Note that, to read the latched value at the node RS, the read operation of FIG. 4 can be performed.

The various operations represented in FIGS. 4 and 5 can be used to perform various functions. At the time that the NVM cell 105 is programmed, it is desirable to verify that the desired bit value has been successfully stored in the NVM cell 105. As such, as soon as a program operation has been performed to program the NVM cell 105 (e.g., by using STT to set resistance levels of the MTJ devices 125 and 130), the transfer operation of FIG. 5 can be performed to transfer the stored bit value from the NVM cell 105 into the VM cell 110, then the read operation of FIG. 4 can be performed to read the transferred bit value from the VM cell 110 at the node RS, and then processing (e.g., external to the memory circuit 100) can be performed to verify that the desired bit value has been successfully stored in the NVM cell 105. Similarly, to verify that the VM cell 110 is operating properly, the write and read operations operation of FIG. 4 can be performed intermittently to determine whether a single event upset (SEU) incident has occurred that changes the bit value stored in the VM cell 110.

Note that, in typical integrated circuits, the output nodes Q and QB will be used for on-line operations, while the output node RS will be reserved for circuit testing and programming verification.

Because the VM cell 110 can be isolated from the NVM cell 105, the VM cell 110 can be selectively programmed and re-programmed both before and after an NVM-stored bit value has been transferred from the NVM cell 105 to the VM cell 110. Furthermore, even after the VM cell 110 has been re-programmed to have a different bit value, the transfer operation can be repeated to re-program the VM cell 110 with the NVM-stored bit value. This functionality is useful in many integrated circuit applications. In addition, the NVM cell 105 may itself be programmed and re-programmed, such as by changing the resistance level presented by the MTJ devices 125 and 130.

On the other hand, there may be integrated circuits for which VM-programmability is not needed. In that case, it might not be necessary to be able to transfer and latch an NVM-stored bit value from the NVM cell 105 into a volatile memory cell, like the VM cell 110, that can retain the value after the NVM cell 105 has been isolated. As such, in an alternative embodiment, some or all of the transmission gate 180 and the transistor devices 155, 160, and 165 may be omitted. In this case, the inverters 170 and 175 may be said to form volatile memory circuitry that is not a programmable VM cell per se. As such, after the NVM cell 105 has been programmed, as long as appropriate NVM transfer voltages are applied, the NVM-stored bit value will be continuously presented at the output node Q and its complement at the output node QB.

The NVM cell 105 can be said to function as a programmable resistor-divider network. The MTJ devices 125 and 130 may each present a low resistance level or a high resistance level. In some cases, the MTJ devices 125 and 130 are at opposite resistance levels, such that one of the MTJ devices 125 and 130 is at the low resistance level while the other is at the high resistance level. An example ratio between the high resistance level to the low resistance level is 2, although other ratios may be utilized in other implementations.

A set of NVM cells, such as one or more instances of the NVM cell 105 of FIG. 1, can be programmed to store configuration data for an integrated circuit, such as an FPGA. When the FPGA is initially powered up, the configuration data can be transferred from those NVM cells to corresponding VM cells. By distributing and co-locating instances of the NVM cells with corresponding instances of the VM cells throughout the FPGA, the amount of energy used during such configuration operations and the time that it takes to perform those operations can both be significantly lower than for comparable integrated circuits that use co-located arrays of NVM cells to store and transfer configuration data to distributed VM cells. As such, certain embodiments of this invention provide low-energy, distributed (zero-latency) NVM cells with minimal penalty in terms of both silicon area and process complexity. In general, memory circuits of the invention may provide one or more of the following advantages:

Differential comparison with unprogrammed NVM cell maximizes yield and system-level reliability;

"Live at power-up" capability;

Elimination of the power supply energy associated with initialization from a separate memory store;

Power-gating of configuration bit cells without the penalty of re-initialization power and time;

Compatibility with lower supply voltages (no retention issues); and

Incremental extension to two or more configuration images which may be selected at run time.

The foregoing described memory circuits implemented with N-type devices. Those skilled in the art will understand that memory circuits can also be implemented with P-type devices.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nano-tubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An article of manufacture comprising:
   a memory circuit comprising:
      a programmable volatile memory (VM) cell; and
      a programmable non-volatile memory (NVM) cell configured to generate an NVM output signal indicative of a program state of the NVM cell, the NVM cell comprising:
         a first magnetic tunnel junction (MTJ) device;
         a second MTJ device;
         a first select device connected with the first MTJ device at a first node;
         a second select device connected with the second MTJ device at a second node;
         a first pass device connected between the first node and an input node of the VM cell and configured to selectively pass a voltage at the first node to the input node; and
         a second pass device connected between the second node and the input node and configured to selectively pass a voltage at the second node to the input node, wherein the first and second select devices are controllable by a common program-enable control signal, and wherein the VM cell is connected to receive the NVM output signal from the NVM cell at the input node and generate an output signal indicative of the program state of the NVM cell.

2. The article of claim 1, wherein the VM cell comprises a first inverter comprising an input to receive the NVM output signal and to generate a first inverted signal at an output as the output signal.

3. The article of claim 1, wherein the VM cell is a static random-access memory (SRAM) cell, wherein the first select device is connected to the second select device, and wherein the first pass device is connected to the second pass device.

4. The article of claim 1, wherein:
   the NVM cell is programmable to have a first programmed state by (i) programming the first MTJ device to operate in a first resistance mode and (ii) programming the second MTJ device to operate in a second resistance mode; and
   the NVM cell is programmable to have a second programmed state different from the first programmed state by (i) programming the first MTJ device to operate in the second resistance mode and (ii) programming the second MTJ device to operate in the first resistance mode.

5. The article of claim 4, wherein:
   the VM cell is drivable using the NVM cell by (i) turning off the first and second select devices, (ii) applying read voltages to the first and second MTJ devices, and (iii) turning on the first and second pass devices to pass a shorted voltage at the first and second nodes to the input node.

6. The article of claim 4, further comprising control logic configured to program the first MTJ device and the second MTJ device using a thermal assisted switching technique or a spin torque transfer technique, wherein the memory circuit is part of an integrated circuit comprising multiple instances of the memory circuit distributed over the integrated circuit, and wherein, for each instance of the memory circuit, the NVM cell is co-located with the VM cell.

7. The article of claim 5, wherein the VM cell is drivable by:
programming the NVM cell to have either the first or second programmed state; and then driving the VM cell using the NVM cell such that:
if the NVM cell is programmed in the first programmed state, then the NVM output signal drives the VM cell based on the first programmed state; and
if the NVM cell is programmed in the second programmed state, then the NVM output signal drives the VM cell based on the second programmed state.

8. The article of claim 5, wherein the NVM cell in operation implements a programmable voltage divider.

9. The article of claim 6, wherein the integrated circuit is a field-programmable gate array.

10. The article of claim 1, wherein:
the first and second pass devices are controllable by a common transfer-enable control signal.

11. A method for operating a programmable Non-Volatile Memory (NVM) cell configured to generate an NVM output signal indicative of a program state of the NVM cell, the NVM cell comprising:
a first magnetic tunnel junction (MTJ) device;
a second MTJ device;
a first select device connected with the first MTJ device at a first node;
a second select device connected with the second MTJ device at a second node;
a first pass device connected between the first node and a NVM output node and configured to selectively pass a voltage at the first node to the NVM output node; and
a second pass device connected between the second node and the NVM output node and configured to selectively pass a voltage at the second node to the NVM output node, the method comprising reading a bit value from the NVM cell by:
turning off the first select device;
applying a read voltage to the first MTJ device; and
turning on the first pass device to pass the voltage at the first node to the NVM output node;
when the first MTJ device is in a first resistance mode, the voltage at the first node passed to the NVM output node will be at a first level; and
when the first MTJ device is in a second resistance mode, the voltage at the first node passed to the NVM output node will be at a second level different from the first level.

12. The method of claim 11, wherein:
turning off the first select device comprises turning off the first and the second select devices;
applying a read voltage to the first MTJ device comprises applying read voltages to the first MTJ device and the second MTJ device; and
turning on the first pass device comprises turning on the first pass device and the second pass device to pass a shorted voltage at the first and second nodes to the NVM output node;
if the first MTJ device is in the first resistance mode and the second MTJ device is in the second resistance mode, the shorted voltage passed to the NVM output node will be at the first level; and
if the first MTJ device is in the second resistance mode and the second MTJ device is in the first resistance mode, the shorted voltage passed to the NVM output node will be at the second level.

13. The method of claim 11, further comprising programming the first MTJ device and the second MTJ device using a thermal assisted switching technique or a spin torque transfer technique, wherein the NVM cell functions as a programmable voltage divider.

14. The method of claim 11, wherein the method further comprises reading an other bit value from the NVM cell by:
turning off the second select device;
applying a read voltage to the second MTJ device; and
turning on the second pass device to pass the voltage at the second node to the NVM output node;
if the second MTJ device is in the first resistance mode, then the voltage at the second node passed to the NVM output node will be at a third level; and
if the second MTJ device is in the second resistance mode, then the voltage at the second node passed to the NVM output node will be at a fourth level different from the third level.

15. The method of claim 11, further comprising controlling the first and second select devices by a common program-enable control signal and controlling the first and second pass devices by a common transfer-enable control signal.

16. An article of manufacture comprising:
a memory circuit comprising:
a programmable non-volatile memory (NVM) cell configured to generate an NVM output signal indicative of a program state of the NVM cell, the NVM cell comprising a first magnetic tunnel junction (MTJ) device, a first select device connected with the first MTJ device at a first node, a first pass device connected between the first node and a NVM output node, a second MTJ device, a second select device connected in series with the first select device and connected with the second MTJ device at a second node, and a second pass device connected between the second node and the NVM output node; and
a programmable volatile memory (VM) cell configured to receive the NVM output signal at a VM input node and to generate a VM output signal indicative of the program state of the VM cell, wherein the first pass device is connected between the first node and the VM input node and configured to selectively pass a voltage at the first node to the VM input node.

17. The article of manufacture of claim 16, wherein the first pass device is connected to the second pass device, and wherein the first and second pass devices are controllable by a common transfer-enable control signal.

18. The article of manufacture of claim 16, wherein the memory circuit further comprises control logic configured to program the NVM cell, and wherein the control logic is configured to program the NVM cell by programming the first MTJ device and the second MTJ device using a thermal assisted switching technique or a spin torque transfer technique.

19. The article of manufacture of claim 16, wherein the first and second select devices are controllable by a common program-enable control signal.

20. The article of manufacture of claim 16, wherein the first MTJ device is connected to a first voltage supply, and wherein the second MTJ device is connected to a second voltage supply different from the first voltage supply.

* * * * *